(12) United States Patent
Chen et al.

(10) Patent No.: US 7,186,380 B2
(45) Date of Patent: Mar. 6, 2007

(54) TRANSISTOR AND SENSORS MADE FROM MOLECULAR MATERIALS WITH ELECTRIC DIPOLES

(75) Inventors: Yong Chen, Palo Alto, CA (US); Alexandre M. Bratkovski, Mountain View, CA (US); R. Stanley Williams, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 613 days.

(21) Appl. No.: 10/187,721

(22) Filed: Jul. 1, 2002

(65) Prior Publication Data
US 2004/0001778 A1 Jan. 1, 2004

(51) Int. Cl.
*B32B 5/02* (2006.01)
*B32B 27/04* (2006.01)
*B32B 27/12* (2006.01)
*B32B 27/00* (2006.01)
*G01N 15/06* (2006.01)

(52) U.S. Cl. .......... 422/82.01; 422/50; 422/68.1; 422/69; 422/83; 422/98; 438/141; 438/142; 438/48; 438/49; 257/1; 257/9; 257/24; 257/25; 257/40; 257/565; 257/414; 257/213

(58) Field of Classification Search .......... 422/50, 422/68.1, 69, 82.01, 83, 98; 438/141, 142, 438/48, 49; 257/1, 9, 24, 25, 40, 565, 414, 257/213
See application file for complete search history.

(56) References Cited

U.S. PATENT DOCUMENTS 5,034,608 A * 7/1991 Tavrow et al. .......... 250/338.3
5,471,069 A * 11/1995 Nakamura et al. .......... 257/39
5,864,161 A * 1/1999 Mitani et al. .......... 257/347
6,858,162 B1 * 2/2005 Kornilovich .......... 252/500
2002/0075420 A1 6/2002 Zhang et al.
2004/0238814 A1 * 12/2004 Mizusaki et al. .......... 257/40
2005/0023522 A1 * 2/2005 Frey et al. .......... 257/40
2005/0062097 A1 * 3/2005 Misra et al. .......... 257/324

FOREIGN PATENT DOCUMENTS

| DE | 10013013 | 3/1999 |
| EP | 0448268 | 3/1991 |
| GB | 15721181 | 7/1980 |

OTHER PUBLICATIONS

Crossfire Beilstein—May 1992.
S R Forrest—"Organic-on-Inorganic Semiconductor Heterojunctions: Building Block for the Next Generation of Optoelectronic Devices?"—IEEE Circuits and Devices Magazine—vol. 5 No. 3—May 1989—pp. 33-37.
P E Kornilovitch et al—"Bistable Molecular Conductors With a Field-Switchable Dipole Group"—Physical Review B—vol. 66 No. 24—Dec. 2002—pp. 24513-1 to 245413-7.

(Continued)

*Primary Examiner*—Brian Sines

(57) ABSTRACT

A polarization-dependent device is provided that includes organic materials having electric dipoles. The polarization-dependent device comprises: (a) a source region and a drain region separated by a channel region having a length L, formed on a substrate; (b) a dielectric layer on at least a portion of the channel region; and (c) a molecular layer on the dielectric layer, the molecular layer comprising molecules having a switchable dipolar moiety. Addition of a gate over the molecular layer permits fabrication of a transistor, while omission of the gate, and utilization of suitable molecules that are sensitive to various changes in the environment permits fabrication of a variety of sensors. The molecular transistor and sensors are suitable for high density nanoscale circuits and are less expensive than prior art approaches.

31 Claims, 2 Drawing Sheets

OTHER PUBLICATIONS

Crossfire Beilstein—Feb. 2000.

Chu-Liang Cheng et al—"Novel Organic-On-InP Field-Effect Transistor"—Applied Physics Letters—vol. 47 No. 11—Dec. 1985—pp. 1217-1219.

M C Petty—"Molecular Electronics: Prospects for Instrumentation and Measurement Science"—Measurement Science and Technology—vol. 7 No. 5—May 1996—pp. 725-735.

S Roth—"Density of States and Tunneling Spectroscopy on Molecular Nanostructures"—Thin Solid Films—vol. 331 No. 1-2—Oct. 1998—pp. 45-50.

Chou, Stephen Y. et al, "Ultrafast and Direct Imprint of Nanostructures in Silicon", Nature, vol. 417, Jun. 20, 2002, pp. 835-837.

Kagan, C. R. et al, "Organic-Inorganic Hybrid Materials as Semiconducting Channels in Thin-Film Field-Effect Transistors", Science, vol. 286, Oct. 20, 1999, pp. 945-947.

Blinov, L.M. et al, "Two-dimensional ferroelectrics", Physics—Uspekhi 43 (3), 2000, pp. 243-257.

Barbaro, Aurelio et al, "CHEMFET Devices for Biomedical and Environmental Application," Adv. Mater, 4, (1992), pp. 402-408.

Morales, Alfredo M. et al, "A Laser Ablation Method for the Synthesis of Crystalline Semiconductor Nanowires", Science, vol. 279, Jan. 9, 1998, pp. 208-211.

m

* cited by examiner

TRANSISTOR AND SENSORS MADE FROM MOLECULAR MATERIALS WITH ELECTRIC DIPOLES

TECHNICAL FIELD

The present invention is directed generally to electronic devices whose functional length scales are measured in nanometers, and, more particularly, to transistors and sensors employing molecules with switching dipole groups.

BACKGROUND ART

As is well known, the conventional field effect transistor (FET) is made mainly from semiconductor materials (see FIG. 1a), where the electric carriers in the semiconductor region between source and drain are influenced by a voltage applied to the gate. In other words, the conductance between the source and drain is controlled by the gate voltage.

When the size of the transistor (L in FIG. 1a) is reduced to nanometer scale (<15 nm), the separation between the source and drain is too small to allow the gate to effective affect the carrier density. As a consequence, a nanoscale FET will not work in the same fashion as a semiconductor FET.

A prior art hybrid organic transistor has a structure as shown FIG. 1b, where the conductance of an organic layer between source and drain is controlled by the voltage applied to the gate, in the same way that the conductance between the source and drain is controlled by the gate voltage on the semiconductor transistor of FIG. 1a. By "hybrid" is meant that the channel is an organic compound, but everything else is conventional Si technology layout; see, e.g., C. R. Kagan et al, Science, Vol. 286, pp. 945–947 (Oct. 29, 1999). Usually, a relatively high gate voltage is needed to change the conductance of the organic layer. The conductance and mobility for the organic layer is low, usually smaller than 1 $cm^2/(V \cdot s)$, the gate voltage is large (30 to 50V), and therefore the switching speed of the transistor is slow. It will be noted that in this design the current channel is organic, and the gate oxide and the gate are those used in conventional silicon technology. In contrast, in the embodiments disclosed herein, the organic layer is the insulator with polarization, which is controlled by the applied external field. The gating effect on a semiconducting channel is achieved by the electrostatic potential created by an organic ferroelectric insulator, which may be in direct contact with the channel, or separated from it by a dielectric layer.

A prior art ferroelectric transistor has a structure as shown in FIG. 1c, where the polarization of the underlying ferroelectric layer influences the conductance of the underneath the semiconductor layer between the source and drain. Such a transistor can be used for nonvolatile memory applications, and is usually called a ferroelectric memory field effect transistor (FEMFET). The problem with making short gate devices (L<100 nm) is that the switching properties of the ferroelectric element apparently deteriorate at smaller sizes.

A prior art chemical FET (chemFET) sensor is illustrated in FIG. 1d, and is used for detecting particular chemical species. The chemFET comprises the channel region and source and drain electrodes, all grown on an insulator layer. The channel is exposed to the molecules in the surrounding environment, which can chemisorp directly on a channel region. The chemisorption changes the density of carriers in the channel and, consequently, its conductance. The change in conductance is used to detect the molecular species (hence, the term "chemFET"). ChemFET devices are described by, for example, A. Barbaro et al, Advanced Materials, Vol. 4, pp. 402–408 (1992).

There is a significant technological opportunity for a transistor and/or sensor element that is based on molecular materials for its operation.

DISCLOSURE OF INVENTION

In accordance with a first embodiment disclosed herein, a molecular polarization-dependent device is provided that includes organic materials having electric dipoles. The molecular polarization-dependent device comprises:
  (a) a source region and a drain region separated by a channel region having a length L, formed on a substrate; and
  (b) a molecular layer over the channel region, the molecular layer comprising molecules having a switchable dipolar moiety.

There may or may not be a dielectric layer on at least a portion of the channel region. If the dielectric layer is present, then the molecular layer is formed on the dielectric layer. If the dielectric layer is absent, then the molecular layer is formed on the channel region.

In accordance with a second embodiment disclosed herein, a transistor is provided, which also includes the organic materials having electric dipoles. The transistor comprises:
  (a) a source region and a drain region separated by a channel region fabricated from semiconductor or organic materials having a length L within a range of about 1 to 100 nm, formed on a substrate, wherein the channel region comprises a semiconductor material;
  (b) a molecular layer over channel region, the molecular layer comprising molecules having a switchable dipolar moiety; and
  (c) a gate electrode having a width w within a range of about 1 to 100 nm on the molecular layer.

As above, there may or may not be a dielectric layer on at least a portion of the channel region. If the dielectric layer is present, then the molecular layer is formed on the dielectric layer. If the dielectric layer is absent, then the molecular layer is formed directly on the channel region.

The molecular transistor, comprising organic materials with electric dipoles, as disclosed herein has several advantages over previous semi-conductor and organic transistors: it is suitable for high density nanoscale circuits; the gate of the transistor has an effective influence on the conductance between the source and drain; and it may be less expensive than prior art approaches. Likewise, sensors condtructed with similar components will have similar advantages over prior art sensors.

In accordance with a third embodiment disclosed herein, a sensor is provided, which also includes the organic molecules having electric dipoles. The sensor comprises:
  (a) a source region and a drain region separated by a channel region having a length L within a range of about 1 to 100 nm, formed on a substrate; and
  (b) a molecular layer over the channel region, the molecular layer comprising molecules having a switchable dipolar moiety.

As above, there may or may not be a dielectric layer on at least a portion of the channel region. If the dielectric layer is present, then the molecular layer is formed on the dielectric layer. If the dielectric layer is absent, then the molecular layer is formed directly on the channel region.

The sensor is tailorably responsive to various environmental parameters including, but not limited to, (a) photons, which cause the sensor to operate as an optical sensor, (b) pH, moisture, chemical species, and biological agents, which cause the sensor to operate as a chemical or biological sensor, (c) temperature, which causes the sensor to operate as a thermal sensor, and (d) pressure, which causes the sensor to operate as a pressure sensor.

BEST MODES FOR CARRYING OUT THE INVENTION

Definitions

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read-only memory (PROM), for example.

The term "reconfigurable" means that a switch can change its state multiple times via a reversible process such as an oxidation or reduction or by an electric field-induced mechanical motion; in other words, the switch can be opened and closed multiple times, such as the memory bits in a random access memory (RAM).

The term "bi-stable" as applied to a molecule means a molecule having two relatively low energy states separated by an energy (or activation) barrier. The molecule may be either irreversibly switched from one state to the other (singly configurable) or reversibly switched from one state to the other (reconfigurable).

Micron-scale dimensions refers to dimensions that range from 1 micrometer to a few micrometers in size.

Sub-micron scale dimensions refers to dimensions that range from 1 micrometer down to 0.05 micrometers.

Nanometer scale dimensions refers to dimensions that range from 0.1 nanometers to 50 nanometers (0.05 micrometers).

Micron-scale and submicron-scale wires refers to rod or ribbon-shaped conductors or semiconductors with widths or diameters having the dimensions of 0.05 to 10 micrometers, heights that can range from a few tens of nanometers to a micrometer, and lengths of several micrometers and longer.

"HOMO" is the common chemical acronym for "highest occupied molecular orbital", while "LUMO" is the common chemical acronym for "lowest unoccupied molecular orbital". HOMOs and LUMOs are responsible for electronic conduction in molecules.

Prior Art Structures.

Figure 1A:
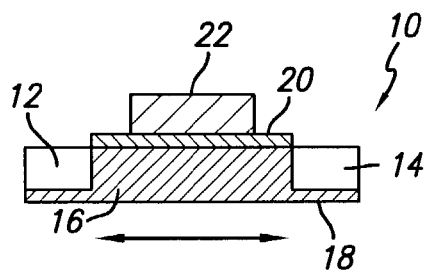
FIG. 1a depicts a prior art semiconductor field effect transistor (FET)

As shown in FIG. 1a, the prior art semiconductor FET 10 comprises a source region 12, and a drain region 14, separated by a channel region 16, formed in a semiconductor substrate 18. The source and drain regions 12, 14 are of the opposite dopant conductivity as the channel region 16. A dielectric layer 20 is formed on the surface of the substrate 18, between the source and drain regions 12, 14, and a metal gate 22 is formed on the dielectric layer. Contacts (not shown) may be made to the source and drain regions 12, 14. Application of a voltage to the gate 22 controls the carrier (electron—hole) flow between the source and drain regions 12, 14.

Figure 1B:
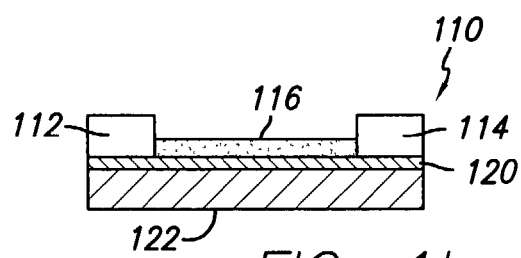
FIG. 1b depicts a prior art organic FET.

As shown in FIG. 1b, the prior art organic FET 110 comprises a source region 112 and a drain region 114, both formed on a dielectric layer 120. The dielectric layer in turn is formed on a gate 122. An organic layer 116 separates the source and drain regions 112, 114 and serves as the channel region. Again, application of a voltage to the gate 122 controls conductance through the organic layer 116 between the source and drain regions 112, 114.

Figure 1C:
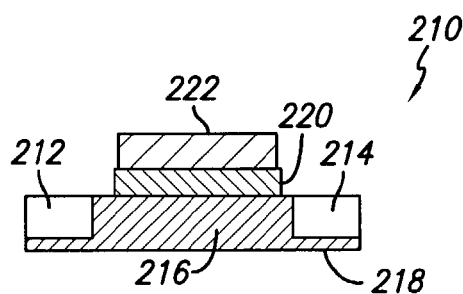
FIG. 1c depicts a prior art ferroelectric transistor.

As shown in FIG. 1c, the prior art ferroelectric FET 210 comprises a source region 212, a drain region 214, and a channel region 216 therebetween, formed in a semiconductor substrate 218. In place of the dielectric layer 20 of the semiconductor FET, a ferroelectric layer 220 is used to separate a gate 222 from the channel region 216.

Figure 1D:
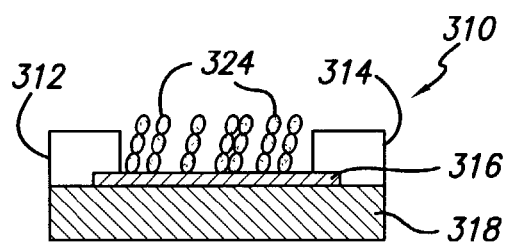
FIG. 1d depicts a prior art chemical FET sensor.

As shown in FIG. 1d, the prior art chemFET 310 comprises a source region 312, a drain region 314, and a channel region 316 therebetween, formed on an insulating substrate 318. Adsorbed molecules 324 are chemi-sorbed directly on the channel region 316; their presence changes the density of carriers in the channel and, consequently, its conductance.

The Structure of the Devices of the Present Embodiments.

Figure 2:
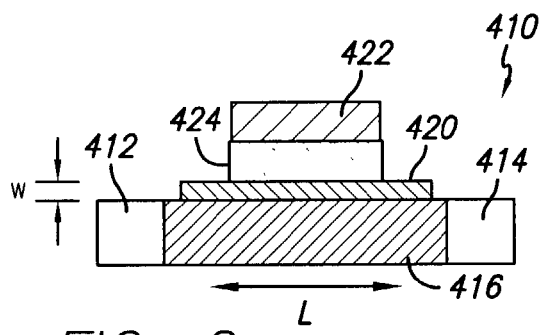
FIG. 2 depicts an embodiment of a nanometer-scale molecular FET
Figure 2A:
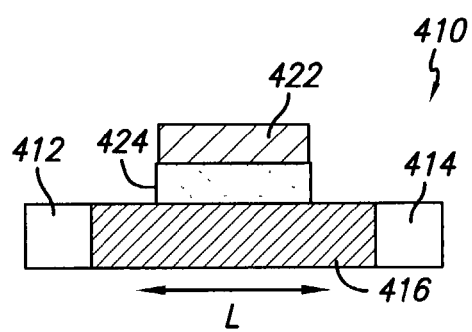
FIG. 2a depicts an alternate embodiment of FIG. 2.

Turning now to FIG. 2, an embodiment of the present transistor structure 410 comprises a source region 412 and a drain region 414 separated by a channel region 416. Preferably, the channel region 416 comprises a semi-conductor. A dielectric layer 420 is formed on the channel region 416, between the source and drain regions 412, 414, and a gate 422 is formed over the dielectric layer 420. However, compared with the conventional transistor structure (FIG. 1a), an extra organic layer 424 is inserted between the gate 422 and the dielectric layer 420. The dielectric layer 420 may be needed to eliminate the interfacial charge between the semiconductor (channel region 416) and the organic layer 424. On the other hand, the dielectric layer 420 may be omitted if the surface charge can be eliminated by some other method, such as direct bonding between the molecules and the semiconductor. In that case, the molecular layer 424 is formed directly on the channel region 416, as shown in FIG. 2a.

In addition to the foregoing difference from the prior art transistor structure, another major difference is that the transistor disclosed and claimed herein is at nanometer scale; the length L and thickness w of the gate are each in the range of 1 to 100 nm.

Examples of suitable dielectric materials employed in the practice of the various embodiments disclosed herein include, but are not limited to, $SiO_2$, $Al_2O_3$, MgO, CaO, $ZrSiO_4$, $ZrO_2$, $Y_2O_3$, $HfSiO_4$, $Y_2O_3$, $HfO_2$, $Si_3N_4$, SrO, $La_2O_3$, $Ta_2O_3$, BaO, and $TiO_2$.

Theory.

When a voltage $V_g$ is applied between the gate 422 and drain 414, molecules with dipole moments under the gate can be polarized. The gate voltage $V_g$ and the top surface potential of the semiconductor, $\phi_s$, are related as follows:

$$V_g - \phi_s = -\sigma_s/C - P\, d_m/(\epsilon_0 \epsilon_m) \quad (1)$$

where C is the capacitance given by $$C = (1/C_m + 1/C_i)^{-1},$$

where $$C_m = \epsilon_0 \epsilon_m / d_m$$

and $$C_i = \epsilon_0 \epsilon_i / d_i$$

where $\epsilon_m$ is the dielectric constant of the molecular layer 424, $d_m$ is the thickness of the molecular layer; $\epsilon_i$ is the dielectric constant of the dielectric layer 420, and $d_i$ is the thickness of the dielectric layer. The polarization of the molecular layer 424 is P, which is a function of the electric field and/or the history of the electric field E and is switchable by the electric field. The symbol $\sigma_s$ represents the charge density per area in the semiconductor layer 416. Since the metal (gate 422) and the molecular layer 424 are directly contacted, it can be assumed that the net charge in the molecular layer is zero.

Compared with ferroelectric solid state materials, molecules can have larger dipole moments due to the large displacement of positive and negative charge in a molecule. Usually, a molecule can have a dipole moment of a few Debye (~$3.3 \times 10^{-30}$ Coulomb-meter) within a small molecular volume (~$10^{-29}$ m$^3$). If well-aligned, the polarization of a molecular crystal comprising an array of polar molecules, can reach the order of ~0.1 C/m$^2$, comparable to the best reported ferroelectric solid state materials. As calculated from Eqn. 1, a molecular thin film with such a polarization and a thickness of ~1 nm will generate a surface potential on the semiconductor $\phi_s$ larger than 1 V, which is large enough to influence the conductivity of the semiconductor under the gate (see the following for device analysis).

A ferroelectric solid state layer generally consists of regions called domains, within each of which the polarization is in the same direction. The domains usually appear when the bound charge created by the polarization itself at the surface of the ferroelectric is not fully screened by highly conductive electrodes at the top or the bottom surfaces. If the electrical screening is very good, the domains may still appear in a ferroelectric epitaxial film because of misfit strain appearing due to different lattice constants of the ferroelectric film and the substrate. The known molecular ferroelectrics are "soft" materials and may relieve the stress because the molecular chains are loosely packed together. In this case, the molecules can stay in a monodomain state and be switchable when the size shrinks down to nanometer scale.

Applications.

1. Nanoscale Non-Volatile Memory Transistor.

The polarization direction and/or magnitude of the molecular layer 424 can be switched one way or another by applying an electric field between the gate 422 and the semiconductor layer 416 along different directions. After the electric field is removed, the ferroelectric polarization of the molecular layer 424 will remain and influence the density and type of the carriers inside the semiconductor layer 416, which will in turn set the current between the source 412 and drain 414. From the current, the molecular polarization written by the gate 422 is detected and read. It is similar to the FEMFET, but with the molecular layer 424, the sizes of the devices are much smaller, and thus suitable for high-density nanoscale circuits.

2. Nanoscale Transistor with Gain for Logic Applications.

When a conventional transistor 10 is scaled down to nanometer scale, the subthreshold current remains the same; however, the surface potential for the onset of weak inversion does not scale. Therefore, the transistor 10 cannot function anymore; it will lose voltage gain, which is crucial for logic applications. The molecular layer 424 with a ferroelectric dipole moment between the gate 422 and semiconductor layer 416 will reduce the subthreshold voltage by ~P $d_m/(\epsilon_0 \epsilon_m)$, based on Eqn. 1. Large gain will occur in cases where the spontaneous polarization is large, >$10^{-2}$ C/m$^2$, and the dielectric constant is relatively small, e.g., $\epsilon_m \approx 1$ to 100. With the molecular layer 424, if the thickness of the dielectric layer 420 can be reduced or removed, then the molecular electric dipole moment increase as a function of the electric field, resulting in a higher value of dielectric constant $\epsilon_m$ compared with $\epsilon_i$, and a larger value of the capacitance C in Eqn. 1, eventually leading to larger $\phi$s and the gain. Therefore, the molecular layer 424 with a large electric polarization P will increase the gain of the transistor 410 when it is scaled down to nanometer size.

3. Sensors.

Figure 3:
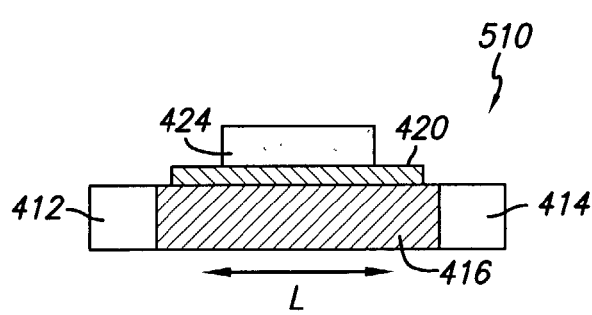
FIG. 3 depicts an embodiment of a nanometer-scale molecular sensor.

Without the gate 422 (FIG. 3), the current between the source 412 and drain 414 can still be influenced by the polarization of the molecules 424, which is in turn influenced by the environment. The polarization can be changed by photons and their intensity; as a consequence, the device 510 will operate as an optical sensor. The polarization can be changed by its chemical environment, such as pH value, moisture, chemical species, and biological elements, etc.; as a consequence, the device 510 will operate as a chemical or biological sensor. The polarization can be changed by temperature; as a consequence, the device will operate as a thermal sensor. The polarization can be changed by environmental pressure; consequently, the device will operate as a pressure sensor. Similarly, changing the environment to thereby influence the polarization of the molecules 424 creates a sensor 510 that may be used to detect and, possibly, measure such a change.

Fabrication.

The semiconductor material employed in the fabrication of the transistor 410 or sensor 510 may be any of the common semiconductor materials, including, without limitation, C, Si, Ge, GaAs, InP, InAs, GaP, AlAs, AlSb, GaSb, InSb, InN, AlN, GaN, etc. Carbon is included in this list based on the fact that carbon nanotubes exhibit semiconducting properties.

The nanoscale semiconductor structure 410, 510 can be fabricated by self-assembly methods, such as carbon nanotube (see, e.g., C. Zhou et al, "Modulated Chemical Doping of Individual Carbon Nanotubes", Science, 290, 1552 (2000)) or Si nanowire grown by chemical and physical methods (see, e.g., A. M. Morales et al, "A Laser Ablation Method for the Synthesis of Crystalline Semiconductor Nanowires", Science, Vol. 279, pp. 208–211 (Jan. 9, 1998)).

The nanoscale semiconductor structure 410, 510 can be fabricated by growing a two-dimensional semiconductor layer 416 at first, and then using nanofabrication processes such as e-beam or imprinting lithography to define the nanoscale structure (see, e.g., Stephen Y. Chou et al, "Ultrafast and direct imprint of nanostructures in silicon", Nature, Vol. 417, pp. 835–837 (Jun. 20, 2002)).

The molecular layer 424 can be formed by self-assembled methods, in which the molecules attach to the dielectric layer 420 or semiconductor surface 416 with stable bonding to form a close-packed molecular layer.

The molecular layer 424 can be formed by Langmuir-Blodgett methods, in which the molecules form a close-packed layer at first and then transfer to the dielectric layer 420 or the semiconductor surface 416.

The molecular layer 424 can be formed by thermal evaporation methods.

The molecular layer 424 can be formed by spin-on techniques.

The source 412, drain 414, and gate 422 can be fabricated with conventional semiconductor processes and by using nanofabrication processes such as e-beam or imprinting lithography to define the nanoscale structure (see, e.g., the Chou reference above).

Molecules.

The molecule employed in the molecular layer 424 has to include a switchable dipolar moiety. Preferably, the molecule includes a bi-stable switchable dipolar moiety. The bi-stability is optional with non-memory applications, such as logic and sensors, but is required for memory applications.

Figure 4B:
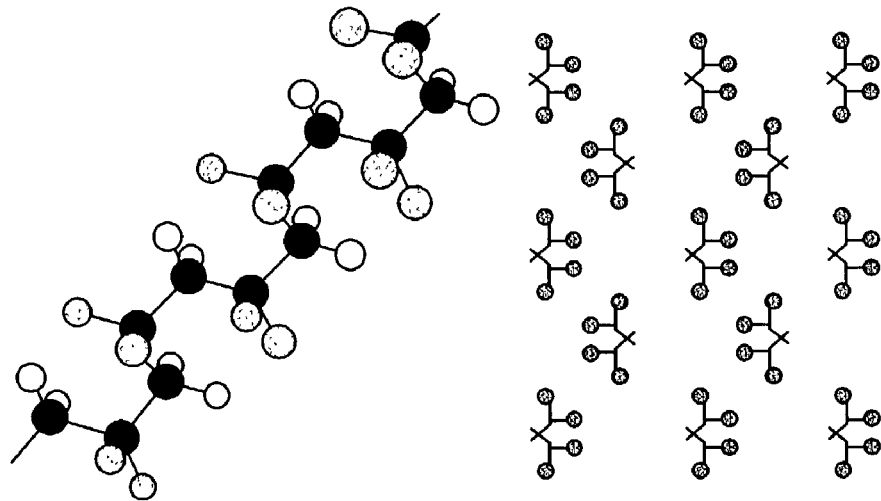
FIGS. 4a–4b depict a copolymer of vinylidene fluoride and trifluoroethylene in two known different phases, the all-trans (TTTT) configuration (FIG. 4a) and the alternating trans-gauche (TG$\overline{T}\overline{G}$) configuration (FIG. 4b).
Figure 4A:
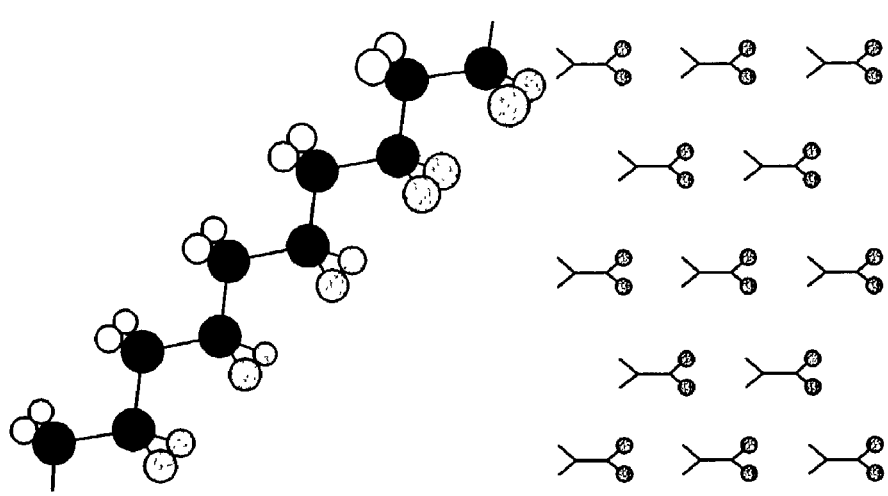

One embodiment of a molecule having a switchable dipolar moiety is the well known molecular ferroelectric, PVDF (polyvinylidene fluoride, $(CH_2-CF_2)n-(CHF-CF_2)_m$) molecular random copolymer, which can form Langmuir-Blodgett films. PVDF is a linear fluorinated hydrocarbon built $(CH_2-CF_2)$ units with spacing 2.6 Å, as shown in FIGS. 4a–4b. below. The PVDF chains have a net dipole moment, pointing from the electronegative fluorine to the electropositive hydrogen, producing a net dipole moment nearly perpendicular to the polymer chain. These chains can crystallize in a quasi-hexagonal close-packed "beta-phase" structure with parallel dipoles producing a polarization $P=0.13$ cm$^{-2}$. Poling and switching are done by applying a large electric field perpendicular to the chains to reverse the direction of polarization. The temperature of the paraelectric-ferroelectric phase transition in PVDF is above its melting temperature. Therefore, most studies of ferroelectric properties were performed on the copolymers P(VDF-TrFE), which are random copolymers of vinylidene fluoride and trifluoroethylene monomers with structure $(CH_2-CF_2)n-(CHF-CF_2)_m$. The copolymers with 50% or less TrFE are ferroelectric, though with reduced polarization and transition temperatures, because some of the hydrogen atoms are replaced with fluorine, reducing the net dipole moment of the polymer chains. Spun polymeric films reveal rapid (about 1 ms) ferroelectric switching, which depends on the electric field and film thickness.

The P(VDF-TrFE 70:30), which is the most studied copolymer, has a maximum spontaneous polarization of $P=0.1$ Cm$^{-2}$, a first order ferroelectric-paraelectric phase transition at $T_c=100°$ C., and a large temperature hysteresis. In the phase transition, the structure changes from the all-trans (TTTT) configuration arranged in a dipole-aligned structure (FIG. 4a) to the alternating trans-gauche (TGTḠ) configuration arranged in a nonpolar structure (FIG. 4b). The copolymer also has a slightly larger unit cell than pure PVDF, owing to the replacement of some of the hydrogen atoms on one side of the chains by the larger fluorine atoms.

High-quality thin films of ferroelectric P(VDF-TrFE 70:30) were fabricated by the horizontal Schaefer variation of the Langmuir-Blodgett monolayer transfer technique. The ferroelectric LB films are polycrystalline with randomly oriented regions of parallel-chain crystals. The ferroelectric LB films have a strong first-order bulk ferroelectric phase transition, and complete reversible polarization switching below $T_c=80°$ C., [The foregoing description follows L. M. Blinov et al, "Two-dimensional ferroelectrics", Uspeckhi Fizicheskikh Nauk (Physics—Uspekhi), Vol. 43, pp. 243–257 (2000).]

Other examples of a molecule having a switchable dipolar moiety include the molecules illustrated below. These polar molecules have bistable polar groups which can be aligned by applied external electric field. Those molecules can have desirable characteristics for the realization of present embodiments and are shown as an illustration of a design used to generate the molecules of interest. The energy barrier is given by the energy to break and make the hydrogen bonds binding dipole rotor to stator (backbone part of the molecule). The barrier may be estimated to be in the range 0.2 to 0.6 eV and can be varied by various compositions of the molecules. Smaller barriers would correspond to shorter lifetime of particular conformational state of the molecule and smaller ordering temperature for dipole groups when there is an interaction between the dipoles on different molecules of a ferroelectric type. The molecules can be ordered by an external field, but a spontaneous ferroelectric ordering should be observed in exceptional cases of particular systems, rather than the rule. Depending on those parameters, one can develop volatile and non-volatile applications of various molecular systems.

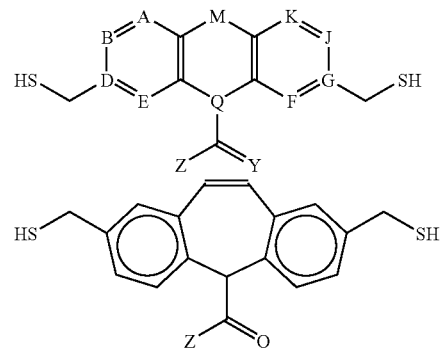

where the letters in Formula (I) are defined as follows:
A=CH; N; C-alkyl; C-halogen; C—OH; C—OR(ether); C—SR(thioether); C-amide; C-ester or thioester;
B=CH; N; C-alkyl; C-halogen; C—OH; C—OR(ether); C—SR(thioether); C-amide; C-ester or thioester;
D, G=C;
E=CH; N; C-alkyl; C-halogen; C—OH; C—OR(ether); C—SR(thioether); C-amide; C-ester or thioester;
F=CH; N; C-alkyl; C-halogen; C—OH; C—OR(ether); C—SR(thioether); C-amide; C-ester or thioester;
J=CH; N; C-alkyl; C-halogen; C—OH; C—OR(ether); C—SR(thioether); C-amide; C-ester or thioester;
K=CH; N; C-alkyl; C-halogen; C—OH; C—OR(ether); C—SR(thioether); C-amide; C-ester or thioester;
M=CH$_2$; CF$_2$; CCl$_2$; CHOCH$_3$; CHOH; CHF; CO; CH=CH; CH$_2$—CH$_2$; S; O; NH; NR; NCOR; or NCOAr;
Q=CH; nitrogen; phosphorus; or boron;

Y=O or S; and

Z=R (H; alkyl); NHR; OR; SR; CHR—NHR; CHR—OR; CHR—SR; CHR—X (halogen); NR—NHR; NR—OR; or NR—SR.

The foregoing molecule is disclosed in application Ser. No. 09/759,438, filed Jan. 12, 2001, filed in the names of Alexandre M. Bratkovski et al, and entitled "Bistable Molecular Mechanical Device with an Appended Rotor Activated by an Electric Field for Electronic Switching, Gating and Memory Applications". In that patent application, nanometer-scale reversible electronic switches are provided that can be assembled to make crossbar circuits that provide memory, logic, and communications functions. The electronic switches, or crossed-wire devices, comprise a pair of crossed wires that form a junction where one wire crosses another at an angle other than zero degrees and at least one connector species connecting the pair of crossed wires in the junction. The junction has a functional dimension in nanometers, wherein at least one connector species.

Further embodiments of suitable molecules include molecules in which the backbone can contain (a) more than three fused benzene rings, (b) 5-membered rings, (c) 7-membered rings, (d) saturated rings, and (e) other saturated and unsaturated groups, supporting the dipole group and/or constituting parts of the backbone of the molecule.

Yet another example of a molecule suitably employed herein comprises a single molecular species that has both diode and switch functionalities. The molecular species is represented by the formula:

where A and B are identical or non-identical, conducting or non-conducting moieties, I is an insulating bridge between A and B, CL and CR are connectors to left and right electrodes, respectively, and the "+" and "−" represent a dipolar moiety.

A specific example of a molecular species with such a structure is shown in, for example, the following designs (state 1 and 2)

state 1

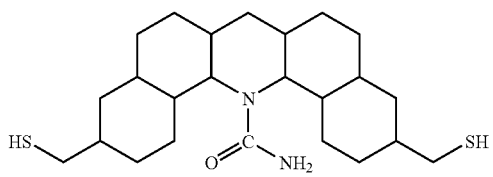

state 2

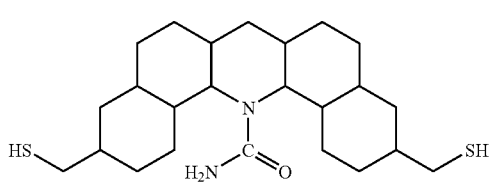

Another example is

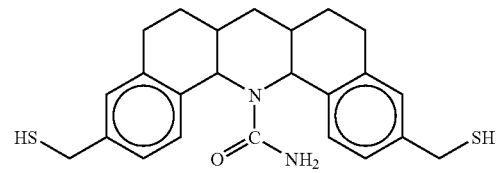

A further example shows two states of structure 1a (state 1) and in structure 1b (state 2).

Structure 1a (state 1)

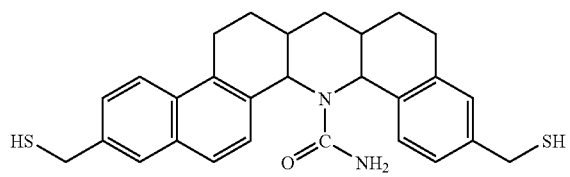

Structure 1a depicts an example of a molecule in state 1. The dipole pole is represented by an amide group —CONH$_2$, with the oxygen carbonyl (=O) being a "−", and the amide (—NH$_2$) being a "+". The groups A and B are represented by naphthalene and benzene, respectively. Connection to the (gold) electrodes (not shown in Formula 1a) is provided by —CH$_2$SH groups (connecting groups CL, CR).

Structure 1b (state 2)

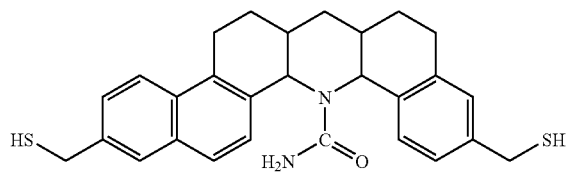

Structure 1b depicts the combination molecule in state 2, where it can be seen that the dipole has rotated 180 degrees with respect to its position in state 1.

Additional examples of such dipole-containing molecules are shown below:

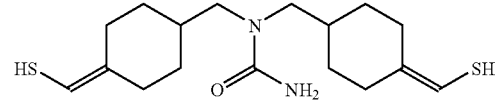

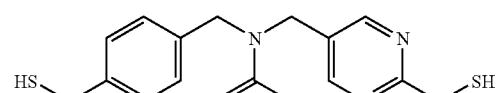

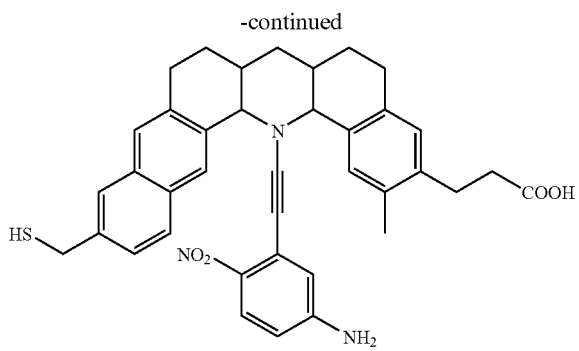

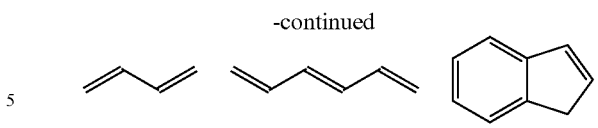

In one embodiment, the A and B moieties are non-conducting; an example of a non-conducting A and B moiety is a saturated hydrocarbon chain or ring for supporting the dipole group. The insulating groups are less polarizable than the conjugated groups and are expected not to screen the electric field, produced by the dipole, to the same extent as the conjugated groups would. It is perferable that the dipole field not be screened by the other parts of the molecule.

In another embodiment, the A and B moieties are conducting and are characterized by relatively small HOMO-LUMO gaps (about 2 to 6 eV) and by the property that their HOMO, LUMO and neighboring molecular orbitals are delocalized and extend over substantially the entire length of the group. The conducting groups A, B may comprise conjugated hydrocarbons and aromatic homo- and hetero-carbocycles. Examples of conducting units are shown below.

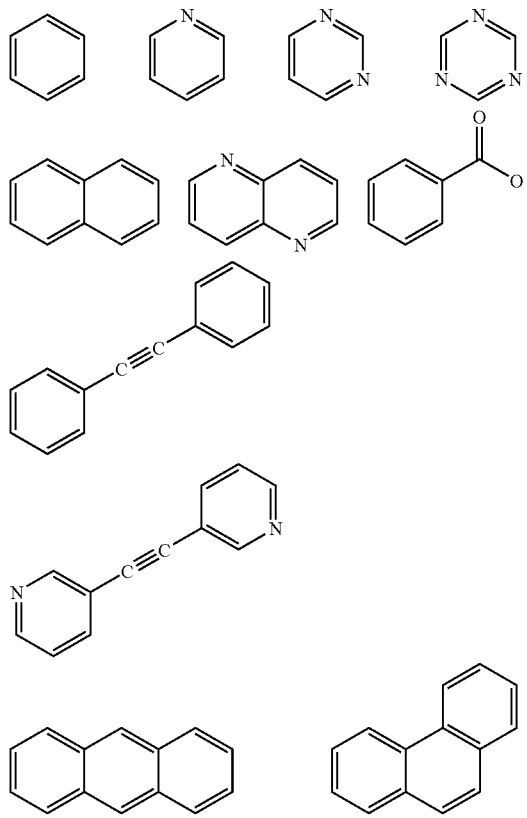

Additionally, the groups A, B may be modified by attaching thereto various side groups such as alkanes, e.g., —CH$_3$, or other functional groups, e.g., —NH$_2$, —NO$_2$, —CN, —OH, —COOH, or —NO. An important design feature is the non-equivalence of the conducting groups A and B. Specifically, they should have different energies of their respective LUMOs. Preferably, the minimum energy separation between the LUMOs of the conducting groups A and B is 0.1 eV.

The insulating group I is characterized by a relatively large HOMO-LUMO gap (about 6 to 10 eV). The insulating group I may comprise saturated hydrocarbons, either cyclic or acyclic. Examples of insulating groups I are shown below.

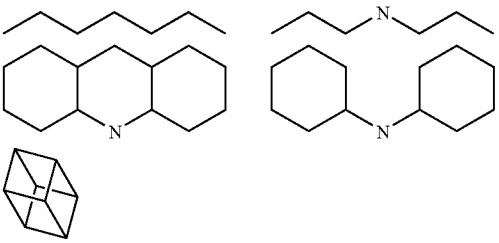

The insulating moiety I may be further modified by attaching thereto various side groups such as alkanes, e.g., —CH$_3$, or other functional groups, e.g., —NH$_2$, —NO$_2$, —CN, —OH, —COOH, or —NO. The important property of the insulating bridge I is that it provides sufficient electrical insulation between the two conducting moieties A and B that it connects. By "sufficient electrical insulation" is meant that hybridization between molecular orbitals of the two conducting moieties A, B is small, less that 1%. This ensures that the orbitals' energies will change independently under the influence of the electric field of the dipolar group. The required insulation is achieved by appropriate selection of the length of the insulating bridge I; such appropriate selection is considered to be well within the ability of the person skilled in this art without undue experimentation.

The dipole has a large dipole moment, >4 Debye. This may be achieved by using a moiety with an electron donor and acceptor attached to its opposite sides. The dipole may alternatively be in zwitterion form. The dipole should also have a strongly localized negative pole, usually due to one or more oxygen atoms, to form hydrogen bonds with the stationary part of the diode-switch molecule. The last important property of the dipole is its connection to the rest of the molecule through either a single or a triple bond that ensures a low energy barrier to dipole's rotation. Examples of the dipolar group are shown below:

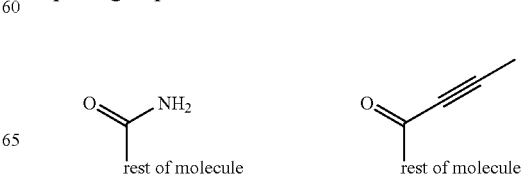

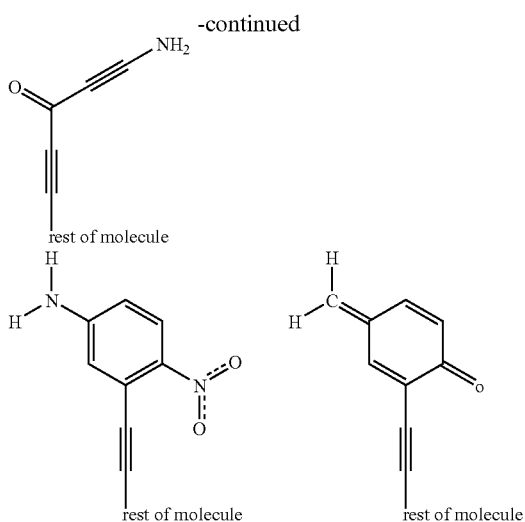

The side, or connector, groups CL, CR provide connection to the electrodes. Therefore, their choice is not independent but should be coordinated with the material of the electrodes as well as with the method of device preparation. For instance, in case of self-assembly on gold, silver, or other noble metals, the side groups CL, CR may be thiols, or thiol-terminated alkenes. In case of Langmuir-Blodgett assembly, the side groups CL, CR may be —COOH-terminated chains or groups. Examples are shown below.

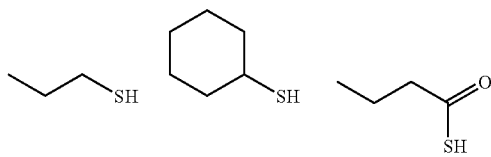

The electrodes to which the dipolar molecule is attached may be metallic or semiconductor. The choice of material is dictated by the device fabrication process, chemical compatibility with the molecular species, and the value of the work function. The work function determines the position of the electrode Fermi level relative to the molecular LUMO. The use of two different electrodes on both sides of the molecule is also contemplated within the scope of the embodiments disclosed herein.

INDUSTRIAL APPLICABILITY

The transistor and sensors disclosed herein are expected to find use in nanoscale devices.

What is claimed is:

1. A transistor comprising:
   (a) a source region and a drain region separated by a channel region having a length L within a range of about 1 to 100 nm, formed on a substrate, wherein said channel region comprises a semiconductor material;
   (b) a dielectric layer on at least a portion of said channel region;
   (c) a molecular layer on said dielectric layer, said molecular layer comprising molecules having a switchable dipolar moiety;
   (d) a gate electrode having a thickness w within a range of about 1 to 100 nm on said molecular layer; and
   (e) said molecules having a polarization direction and magnitude, at least one of which is capable of being changed in response to an electric field applied between said gate electrode and said dielectric layer.

2. The transistor of claim 1 wherein said semiconductor material is selected from the group consisting of C, Si, Ge, GaAs, InP, InAs, GaP, AlAs, AlSb, GaSb, InSb, InN, AlN, and GaN and mixed alloys thereof.

3. The transistor of claim 1 wherein said dielectric layer comprises an oxide.

4. The transistor of claim 3 wherein said oxide is selected from the group consisting of $SiO_2$, $Al_2O_3$, MgO, CaO, $ZrSiO_4$, $ZrO_2$, $Y_2O_3$, $HfSiO_4$, $Y_4O_3$, $HfO_2$, $Si_3N_4$, SrO, $La_2O_3$, $Ta_2O_3$, BaO, and $TiO_2$.

5. The transistor of claim 1 wherein said molecules comprise

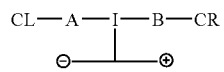

where A and B are identical or non-identical, conducting or non-conducting moieties, I is an insulating bridge between A and B, CL and CR are connectors to left and right electrodes, respectively, and the "+" and "−" represent a dipolar moiety.

6. The transistor of claim 1 wherein said switchable dipolar moiety is bi-stable.

7. The transistor of claim 1 wherein said molecular layer comprises molecules having a ferroelectric dipole moment for non-volatile memory applications.

8. The transistor of claim 1 wherein said molecules comprise:

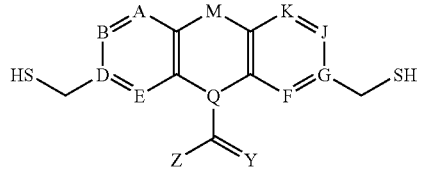

where the letters in the formula are defined as follows:
A=CH; N; C-alkyl; C-halogen; C—OH; C—OR(ether); C—SR(thioether); C-amide; C-ester or thioester;
B=CH; N; C-alkyl; C-halogen; C—OH; C—OR(ether); C—SR(thioether); C-amide; C-ester or thioester;
D,G=C;
E=CH; N; C-alkyl; C-halogen; C—OH; C—OR(ether); C—SR(thioether); C-amide; C-ester or thioester;
F=CH; N; C-alkyl; C-halogen; C—OH; C—OR(ether); C—SR(thioether); C-amide; C-ester or thioester;
J=CH; N; C-alkyl; C-halogen; C—OH; C—OR(ether); C—SR(thioether); C-amide; C-ester or thioester;
K=CH; N; C-alkyl; C-halogen; C—OH; C—OR(ether); C—SR(thioether); C-amide; C-ester or thioester;
M=$CH_2$; $CF_2$; $CCl_2$; $CHOCH_3$; CHOH; CHF; CO; CH=CH; $CH_2$—$CH_2$; S; O; NH; NR; NCOR; or NCOAr;
Q=CH; nitrogen; phosphorus; or boron;
Y=O or S; and
Z=R(H; alkyl); NHR; OR; SR; CHR—NHR; CHR—OR; CHR—SR; CHR—X (halogen); NR—NHR; NR—OR; or NR—SR.

9. The transistor of claim 8 wherein said molecules comprise:

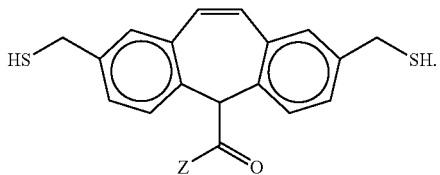

10. A molecular polarization-dependent device comprising:
   (a) a source region and a drain region separated by a channel region having a length L having a value within a range of about 1 to 100 nm, formed on a substrate;
   (b) a molecular layer over said channel region, said molecular layer comprising molecules having a switchable dipolar moiety, wherein said molecules are represented by the formula:

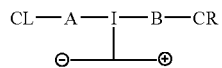

where A and B are identical or non-identical, conducting or non-conducting moieties, I is an insulating bridge between A and B, CL and CR are connectors to left and right electrodes, respectively, and the "+" and "−" represent a dipolar moiety; and
   (c) a mechanism for changing at least one of polarization direction and magnitude of said molecules.

11. The molecular polarization-dependent device of claim 10 further comprising a gate electrode on said molecular layer having a thickness w.

12. The molecular polarization-dependent device of claim 11 wherein w has a value within a range of about 1 to 100 nm.

13. The molecular polarization-dependent device of claim 10 wherein said channel region comprises a semiconductor material.

14. The molecular polarization-dependent device of claim 13 wherein said semiconductor material is selected from the group consisting of C, Si, Ge, GaAs, InP, InAs, GaP, AlAs, AlSb, GaSb, InSb, InN, AlN, and GaN and mixed alloys thereof.

15. The molecular polarization-dependent device of claim 10 further comprising a dielectric layer on at least a portion of said channel region, said molecular layer formed on said dielectric layer.

16. The molecular polarization-dependent device of claim 15 wherein said dielectric layer comprises an oxide.

17. The molecular polarization-dependent device of claim 16 wherein said oxide is selected from the group consisting of $SiO_2$, $Al_2O_3$, MgO, CaO, $ZrSiO_4$, $ZrO_2$, $Y_2O_3$, $HfSiO_4$, $Y_4O_3$, $HfO_2$, $Si_3N_4$, SrO, $La_2O_3$, $Ta_2O_3$, BaO, and $TiO_2$.

18. The molecular polarization-dependent device of claim 10 wherein said switchable dipolar moiety is bi-stable.

19. The molecular polarization-dependent device of claim 10 wherein said molecules comprise:

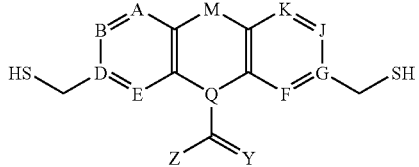

where the letters in the formula are defined as follows:
   A=CH; N; C-alkyl; C-halogen; C—OH; C—OR(ether); C—SR(thioether); C-amide; C-ester or thioester;
   B=CH; N; C-alkyl; C-halogen; ; C—OH; C—OR(ether); C—SR(thioether); C-amide; C-ester or thioester;
   D,G=C;
   E=CH; N; C-alkyl; C-halogen; C—OH; C—OR(ether); C—SR(thioether); C-amide; C-ester or thioester;
   F=CH; N; C-alkyl; C-halogen; C—OH; C—OR(ether); C—SR(thioether); C-amide; C-ester or thioester;
   J=CH; N; C-alkyl; C-halogen; C—OH; C—OR(ether); C—SR(thioether); 0-amide; C-ester or thioester;
   K=CH; N; C-alkyl; C-halogen; C—OH; C—OR(ether); C—SR(thioether); C-amide; C-ester or thioester;
   M=$CH_2$; $CF_2$; $CCl_2$; $CHOCH_3$; CHOH; CHF; CO; CH=CH; $CH_2$—$CH_2$; S; O; NH; NR; NCOR; or NCOAr;
   Q=CH; nitrogen; phosphorus; or boron;
   Y=O or S; and
   Z=R(H; alkyl); NHR; OR; SR; CHR—NHR; CHR—OR; CHR—SR; CHR—X (halogen); NR—NHR; NR—OR; or NR—SR.

20. The molecular polarization-dependent device of claim 19 wherein said molecules comprise:

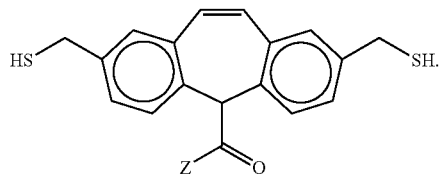

21. A sensor comprising:
   (a) a source region and a drain region separated by a channel region having a length L within a range of about 1 to 100 nm, formed on a substrate;
   (b) a molecular layer over said channel region, said molecular layer comprising molecules having a switchable dipolar moiety, wherein said molecules are represented by the formula:

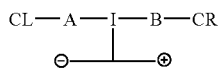

where A and B are identical or non-identical, conducting or non-conducting moieties, I is an insulating bridge between A and B, CL and CR are connectors to left and right electrodes, respectively, and the "+" and "−" represent a dipolar moiety; and
   (c) said molecules having a polarization direction and magnitude, at least one of which is capable of being changed in response to a change in an environment to which said molecular layer is exposed.

22. The sensor of claim 21 wherein said channel region comprises a semiconductor material.

23. The sensor of claim 22 wherein said semiconductor material is selected from the group consisting of C, Si, Ge, GaAs, InP, InAs, GaP, AlAs, AlSb, GaSb, InSb, InN, AlN, and GaN and mixed alloys thereof.

24. The sensor of claim 21 further comprising a dielectric layer on at least a portion of said channel region, said molecular layer formed on said dielectric layer.

25. The sensor of claim 24 wherein said dielectric layer comprises an oxide.

26. The sensor of claim 25 wherein said oxide oxide is selected from the group consisting of $SiO_2$, $Al_2O_3$, MgO, CaO, $ZrSiO_4$, $ZrO_2$, $Y_2O_3$, $HfSiO_4$, $Y_4O_3$, $HfO_2$, $Si_3N_4$, SrO, $La_2O_3$, $Ta_2O_3$, BaO, and $TiO_2$.

27. The sensor of claim 21 wherein said switchable dipolar moiety is bi-stable.

28. The sensor of claim 21 wherein current between said source and said drain is influenced by polarization of said molecules.

29. The sensor of claim 28 wherein said polarization is affected by at least one environmental parameter selected from the group consisting of (a) photons, which cause said sensor to operate as an optical sensor, (b) pH, moisture, chemical species, and biological agents, which cause said sensor to operate as a chemical or biological sensor, (c) temperature, which causes said sensor to operate as a thermal sensor, and (d) pressure, which causes said sensor to operate as a pressure sensor.

30. The sensor of claim 21 wherein said molecules comprise:

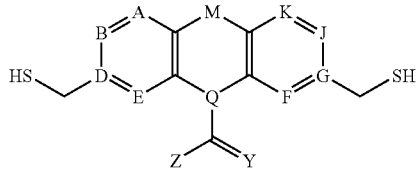

where the letters in the formula are defined as follows:

A=CH; N; C-alkyl; C-halogen; C—OH; C—OR(ether); C—SR(thioether); C-amide; C-ester or thioester;

B=CH; N; C-alkyl; C-halogen; C—OH; C—OR(ether); C—SR(thioether); C-amide; C-ester or thioester;

D,G=C;

E=CH; N; C-alkyl; C-halogen; C—OH; C—OR(ether); C—SR(thioether); C-amide; C-ester or thioester;

F=CH; N; C-alkyl; C-halogen; C—OH; C—OR(ether); C—SR(thioether); C-amide; C-ester or thioester;

J=CH; N; C-alkyl; C-halogen; C—OH; C—OR(ether); C—SR(thioether); C-amide; C-ester or thioester;

K=CH; N; C-alkyl; C-halogen; C—OH; C—OR(ether); C—SR(thioether); C-amide; C-ester or thioester;

M=$CH_2$; $CF_2$; $CCl_2$; $CHOCH_3$; CHOH; CHF; CO; CH=CH; $CH_2$—$CH_2$; S; O; NH; NR; NCOR; or NCOAr;

Q=CH; nitrogen; phosphorus; or boron;

Y=O or S; and

Z=R(H; alkyl); NHR; OR; SR; CHR—NHR; CHR—OR; CHR—SR; CHR—X(halogen); NR—NHR; NR—OR; or NR—SR.

31. The sensor of claim 30 wherein said molecules comprise:

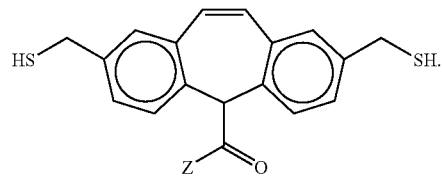

* * * * *

UNITED STATES PATENT AND TRADEMARK OFFICE
CERTIFICATE OF CORRECTION

PATENT NO. : 7,186,380 B2  Page 1 of 1
APPLICATION NO. : 10/187721
DATED : March 6, 2007
INVENTOR(S) : Yong Chen et al.

It is certified that error appears in the above-identified patent and that said Letters Patent is hereby corrected as shown below:

On the Title page, in field (75), in "Inventors", in column 1, line 1, after "Yong" insert -- (NMI) --.

In column 10, line 28, after "dipole" delete "pole".

In column 14, line 13, in Claim 4, delete "$Y_4O_3$," and insert -- $Y_2O_3$, --, therefor.

In column 15, line 65, in Claim 17, delete "$Y_4O_3$," and insert -- $Y_2O_3$, --, therefor.

In column 16, line 15, in Claim 19, after "C-halogen;" delete ";".

In column 16, line 23, in Claim 19, delete "0-amide" and insert -- C-amide --, therefor.

In column 17, line 12, in Claim 26, after "said oxide" delete "oxide".

In column 17, line 14, in Claim 26, delete "$Y_4O_3$," and insert -- $Y_2O_3$, --, therefor.

Signed and Sealed this

Sixth Day of October, 2009

David J. Kappos
*Director of the United States Patent and Trademark Office*